United States Patent
Skordas et al.

(10) Patent No.: US 9,466,538 B1
(45) Date of Patent: Oct. 11, 2016

(54) METHOD TO ACHIEVE ULTRA-HIGH CHIP-TO-CHIP ALIGNMENT ACCURACY FOR WAFER-TO-WAFER BONDING PROCESS

(71) Applicant: GLOBALFOUNDRIES INC., Grand Cayman (KY)

(72) Inventors: Spyridon Skordas, Troy, NY (US); Subramanian S Iyer, Los Angeles, CA (US); Donald Francis Canaperi, Bridgewater, CT (US); Shidong Li, Poughkeepsie, NY (US); Wei Lin, Santa Clara, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/951,634

(22) Filed: Nov. 25, 2015

(51) Int. Cl.
*H01L 21/30* (2006.01)
*H01L 21/66* (2006.01)
(Continued)

(52) U.S. Cl.
CPC .............. *H01L 22/24* (2013.01); *H01L 21/187* (2013.01); *H01L 21/2007* (2013.01); *H01L 21/68* (2013.01); *H01L 21/68771* (2013.01); *H01L 22/20* (2013.01); *H01L 24/33* (2013.01);
(Continued)

(58) Field of Classification Search
CPC ....... H01L 22/20; H01L 22/24; H01L 22/26; H01L 21/187; H01L 21/68; H01L 21/67288; H01L 21/68771; H01L 24/94; H01L 24/33; H01L 24/83; H01L 2224/80948; H01L 2224/94; H01L 25/50
See application file for complete search history.

(56) References Cited

U.S. PATENT DOCUMENTS 5,236,118 A * 8/1993 Bower .................. H01L 21/187
228/105
6,770,852 B1 8/2004 Steger
(Continued)

OTHER PUBLICATIONS

Steven E. Steen, Douglas Latulipe, Anna W. Topol, David J. Frank, Kevin Belote and Dominick Posillico, "Overlay as the key to drive wafer scale 3D integration", Microelectronic Engineering 84 pp. 1412-1415; Feb. 9, 2007.
(Continued)

*Primary Examiner* — Michael Trinh
(74) *Attorney, Agent, or Firm* — DeLio, Peterson & Curcio, LLC; David R. Pegnataro

(57) ABSTRACT

A method of improving chip-to-chip alignment accuracy for circuitry-including wafer-to-wafer bonding. The method comprises providing separate stages for holding first and second circuitry-including wafers, each stage including a plurality of adjacent thermal actuators arranged in an array integrated with the stage; determining planar distortions of a bonding surface of the first and second circuitry-including wafers; mapping the planar distortions for each wafer based on the relative planar distortions thereon; deducing necessary local thermal expansion measurements for each wafer to compensate for the relative distortions based on the mapping; translating the thermal expansion measurements into a non-uniform wafer temperature profile model and a local heat flux profile model for each wafer; aligning the first and second wafers; and bonding the first and second wafers together. The bonding process includes simultaneously thermally treating at least one of the wafers in situ by individually adjusting the temperature of one or more thermal actuators in the array in accordance with the wafer temperature profile model and the local heat flux model to induce thermal expansion over a surface area corresponding to the dimensions of each adjusted thermal actuator.

17 Claims, 9 Drawing Sheets

(51) Int. Cl.
*H01L 25/00* (2006.01)
*H01L 23/00* (2006.01)
*H01L 21/687* (2006.01)
*H01L 21/68* (2006.01)
*H01L 21/18* (2006.01)
*H01L 21/20* (2006.01)

(52) U.S. Cl.
CPC ............... *H01L24/83* (2013.01); *H01L 25/50* (2013.01); *H01L 2224/27849* (2013.01); *H01L 2224/83097* (2013.01); *H01L 2224/83123* (2013.01); *H01L 2224/83125* (2013.01); *H01L 2224/83136* (2013.01); *H01L 2224/83895* (2013.01)

(56) References Cited

U.S. PATENT DOCUMENTS

| | | | |
|---|---|---|---|
| 7,793,698 B2 * | 9/2010 | Hirata | H01L 21/67092 156/498 |
| 7,875,528 B2 * | 1/2011 | La Tulipe, Jr. | H01L 21/67092 257/432 |
| 8,900,885 B1 | 12/2014 | Hubbard et al. | |
| 9,058,974 B2 * | 6/2015 | Lin | H01L 21/02035 |
| 9,059,039 B2 * | 6/2015 | La Tulipe, Jr. | H01L 22/12 |
| 2001/0003901 A1 | 6/2001 | Bolandi et al. | |
| 2007/0266557 A1 | 11/2007 | Drost et al. | |
| 2009/0323039 A1 | 12/2009 | Wardenier | |
| 2012/0077329 A1 | 3/2012 | Broekaart et al. | |
| 2012/0255365 A1 * | 10/2012 | Wimplinger | H01L 21/67092 73/760 |
| 2014/0278213 A1 * | 9/2014 | Hsieh | G03F 7/70633 702/150 |
| 2014/0356983 A1 | 12/2014 | Lin et al. | |
| 2015/0072444 A1 | 3/2015 | LaTulipe, Jr. et al. | |

OTHER PUBLICATIONS

James A. Burns, Brian F. Aull, Chenson K. Chen, Chang-Lee Chen, Craig L. Keast, Jeffrey M. Knecht, Vyshnavi Suntharalingam, Keith Warner, Peter W. Wyatt and Donna-Ruth W. Yost, "A Wafer-Scale 3-D Circuit Integration Technology", Electron Devices, IEEE Transactions on, vol. 53 #10, pp. 2507-2516, Oct. 2006.

Feldman, M. "Thermal compensation of x-ray mask distortions", Journal of Vacuum Science & Technology B, 17(6), pp. 3407-3410, 1999.

Charles D. Schaper, Been-Der Chen, and R. Fabian W. Pease, "Induced thermal stress fields for three-dimensional distortion of Si wafer topography", Review of Scientific Instruments, 75(6), pp. 1997-2002 (2004).

* cited by examiner

METHOD TO ACHIEVE ULTRA-HIGH CHIP-TO-CHIP ALIGNMENT ACCURACY FOR WAFER-TO-WAFER BONDING PROCESS

BACKGROUND OF THE DISCLOSURE

1. Field of the Disclosure

The present disclosure relates generally to microelectronic packaging, three-dimensional integration (3Di), and more specifically to fabrication of stacked semiconductor chip assemblies including bonding of first and second wafer articles to one another and a method of improving chip-to-chip accuracy at the wafer-to-wafer bonding step.

2. Description of Related Art

In the semiconductor device fabrication industry, three dimensional integration (3Di) techniques may be used for integration at the component level as a packaging process or at the device/circuit level. Device/circuit level 3Di includes the combining of different substrates (i.e., wafers), each having patterned circuitry formed thereon, in a manner to form a larger device/circuit by matching appropriate circuit parts together. More specifically, two substrates are placed in contact with each other in an aligned manner, and pressure is applied to initiate the bonding of the two substrates. Semiconductor devices are typically produced in arrays on wafer substrates ranging from 1 to 18 inches in diameter. The substrates are then separated into individual devices or dies that are packaged to allow practical macro-level connection of the devices in the context of a larger circuit. As the requirements for chip density and smaller packaging form factors increase, advances have been made in three-dimensional integration of circuits. In this technology, devices are stacked and bonded in the vertical or z-direction. Typically, the stacked devices are electrically coupled by electrical contact pads on the devices or by through-silicon vias (TSVs).

A typical process for vertically integrating devices on silicon wafers is a wafer-to-wafer integration scheme in which the host wafer and donor wafer are aligned with one another, and the wafers are bonded together using oxide-oxide fusion bonding. The donor wafer is then thinned to expose TSVs that connect to the host wafer, or is thinned followed by fabrication of TSVs that connect to the host wafer. For device/circuit level 3DI applications, the alignment between the two substrates becomes critical due to the circuit connections that need to be made between the patterned circuitry within each substrate. The better the bonding alignment capability, the less misalignment tolerance that needs to be built into circuit designs and therewith the silicon area used for the integrated circuit.

For full-built device wafers, incoming chip-to-chip misalignment plays an important role and needs to be corrected. Incoming chip-to-chip misalignment comes from two major contributions: global wafer-to-wafer incoming runout, and local distortion. It is desirable to eliminate local chip-to-chip misalignment in order to achieve the highest possible chip-to-chip accuracy at the wafer-to-wafer (global) bonding step.

SUMMARY OF THE DISCLOSURE

Bearing in mind the problems and deficiencies of the prior art, it is therefore an object of the present disclosure to provide a method of and system for reducing chip-to-chip misalignment during the wafer-to-wafer bonding process.

It is another object of the present disclosure to provide a method and system that corrects local distortion during chip-to-chip alignment.

A further object of the disclosure is to provide a method of and system for correcting local distortion during chip-to-chip alignment using detailed thermal modeling to predict a specific temperature pattern required to induce thermal expansion or contraction during the bonding step.

Still other objects and advantages of the disclosure will in part be obvious and will in part be apparent from the specification.

The above and other objects, which will be apparent to those skilled in the art, are achieved in the present disclosure which is directed to a method of improving chip-to-chip alignment accuracy for circuitry-including wafer-to-wafer bonding, comprising: providing a first stage for holding a first circuitry-including wafer and a second stage for holding a second circuitry-including wafer, each stage including a plurality of adjacent thermal actuators arranged in an array attached to or integrated with the stage, determining planar distortions of a bonding surface of the first and second circuitry-including wafers, and mapping the planar distortions for each wafer based on the relative planar distortions thereon. The method includes deducing necessary local thermal expansion measurements for each wafer to compensate for the relative distortions based on the mapping, translating the thermal expansion measurements into a non-uniform wafer temperature profile model and a local heat flux profile model for each wafer, aligning the first and second circuitry-including wafers and bonding the first and second wafers together. The bonding process includes simultaneously thermally treating at least one of the wafers in situ by individually adjusting the temperature of one or more thermal actuators in the array in accordance with the wafer temperature profile model and the local heat flux model to induce thermal expansion over a surface area corresponding to the dimensions of each adjusted thermal actuator. The thermal actuator array may have X-Y planar dimensions greater than the diameter of each wafer, and the plurality of thermal actuators may include at least one of a Peltier element and a resistive element. The thermal actuator array may be thermally ground via a thermal ground plane electrically interconnected with the thermal actuator array. In accordance with the method of the present disclosure, thermally treating at least one of the wafers may include correcting for at least one of a local error and a substrate bow.

The method may further comprise the step of, prior to deducing necessary local thermal expansion measurements for each wafer, determining whether the planar distortions for each wafer are within a prescribed tolerance. The non-uniform wafer temperature profile model and local heat flux profile model, respectively, may each comprise at least a thermal diffusivity of the wafer, a mass density of the wafer, and a thermal conductivity of the wafer.

In accordance with the method of the present disclosure, the step of determining planar distortions of a bonding surface of the first and second circuitry-including wafers may comprise determining the position of at least one distortion mark on each wafer. Each distortion mark may be one of: a location on an alignment mark on each wafer and a location on a structure in each wafer. The step of mapping the planar distortions for each wafer may include creating an alignment model for each wafer based on the relative planar distortions thereon, and the alignment model may incorporate translation data, rotation data, magnification data and substrate bow data.

In another aspect, the present disclosure is directed to a system for improving chip-to-chip alignment accuracy for circuitry-including wafer-to-wafer bonding, comprising separate stages for holding a first circuitry-including wafer and a second circuitry-including wafer, each stage including a plurality of adjacent thermal actuators arranged in an array attached to or integrated with the stage; a processor, and a memory having a set of instructions recorded thereon which can be carried out by the processor to cause: determining planar distortions of a bonding surface of the first and second circuitry-including wafers; mapping the planar distortions for each wafer based on the relative planar distortions thereon; deducing necessary local thermal expansion measurements for each wafer to compensate for the relative distortions based on the mapping; translating the thermal expansion measurements into a non-uniform wafer temperature profile model and a local heat flux profile model for each wafer; aligning the first and second circuitry-including wafers; and bonding the first and second wafers together while simultaneously thermally treating at least one of the wafers in situ by individually adjusting the temperature of one or more thermal actuators in the array in accordance with the wafer temperature profile model and the local heat flux model to induce thermal expansion over a surface area corresponding to the dimensions of each adjusted thermal actuator. The thermal actuator array may have X-Y planar dimensions greater than the diameter of each wafer, and the plurality of thermal actuators may include at least one of a Peltier element and a resistive element. The thermal actuator array may be thermally ground via a thermal ground plane electrically interconnected with the thermal actuator array. Thermally treating at least one of the wafers may include correcting for at least one of a local error and a substrate bow.

The non-uniform wafer temperature profile model and local heat flux profile model, respectively, may each comprise at least a thermal diffusivity of the wafer, a mass density of the wafer, and a thermal conductivity of the wafer.

In accordance with the system of the present disclosure, determining planar distortions of a bonding surface of the first and second circuitry-including wafers may comprise determining the position of at least one distortion mark on each wafer. Each distortion mark may be one of: a location on an alignment mark on each wafer and a location on a structure in each wafer. Mapping the planar distortions for each wafer may include creating an alignment model for each wafer based on the relative planar distortions thereon, and the alignment model may incorporate translation data, rotation data, magnification data and substrate bow data.

In still another aspect, the present disclosure is directed to a multi-functional bonding chuck, comprising: a stage for holding a first circuitry-including substrate; an array of adjacent thermoelectric heating units attached to or integrated with the stage; a thermal ground plane electrically interconnected with the thermoelectric heating unit array to ground all adjacent thermoelectric heating units in the array; and a thermoelectric heating unit array controller capable of adjusting the temperature of individual thermoelectric heating units in the array to thermally treat the first circuitry-including substrate to induce thermal expansion over a surface area corresponding to the dimensions of each adjusted thermoelectric heating unit. The thermoelectric heating unit array may have X-Y planar dimensions greater than the diameter of the first circuitry-including substrate, and the array may include at least one of a Peltier element and a resistive element.

BRIEF DESCRIPTION OF THE DRAWINGS

The features of the disclosure believed to be novel and the elements characteristic of the disclosure are set forth with particularity in the appended claims. The figures are for illustration purposes only and are not drawn to scale. The disclosure itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present disclosure, reference will be made herein to FIGS. 1-8 of the drawings in which like numerals refer to like features of the disclosure.

Embodiments of the disclosure described herein are directed to a process that improves local chip-to-chip alignment during wafer-to-wafer bonding. In the disclosed embodiments, planar distortions on the bonding surface of a first and second circuitry-including wafer are detected and the relative distortions of the mating wafers are mapped to create an alignment model. Necessary local thermal expansion measurements for each wafer to compensate for the relative distortions are deduced based on the alignment model, and the alignment model is translated into a non-uniform wafer temperature profile model and a local heat flux profile model for each wafer. The first and second wafers are then bonded together while thermally treating the wafers based on the wafer temperature profile model and the local heat flux model to induce thermal expansion.

As used herein, planar distortions generally refer to distortions along the bonding surface, and may be approximated, for example, by projecting distortions onto the general plane of the bonding surface. Planar distortions on a wafer surface can generally be characterized into three types: expansion distortions, such as barrel distortions and pincushion distortions; rotational distortions, such as twist and spiral distortions; and translational distortions, such as an overall movement of an area in the X-Y plane while maintaining an orientation with respect to the X-Y axes. These distortions may occur at the micro level, for example, a small area of a wafer surface, and at the macro level, for example, over the entire bonding surface of a wafer. In exemplary embodiments, at the macro level, expansion distortions and rotational distortions are generally with respect to the wafer center, with expansion distortion referring to the component of distortion from ideal generally along radii of the wafer, and rotational distortion referring to the component of distortion generally perpendicular to radii of the wafer. In general, planar distortion of a wafer surface can include components of all three types of distortion, at both a macro level and a micro level. The magnitude of these distortions is typically in the parts-per-million range, and may result in macro level distortions from the ideal in the several micron range.

Figure 1B:
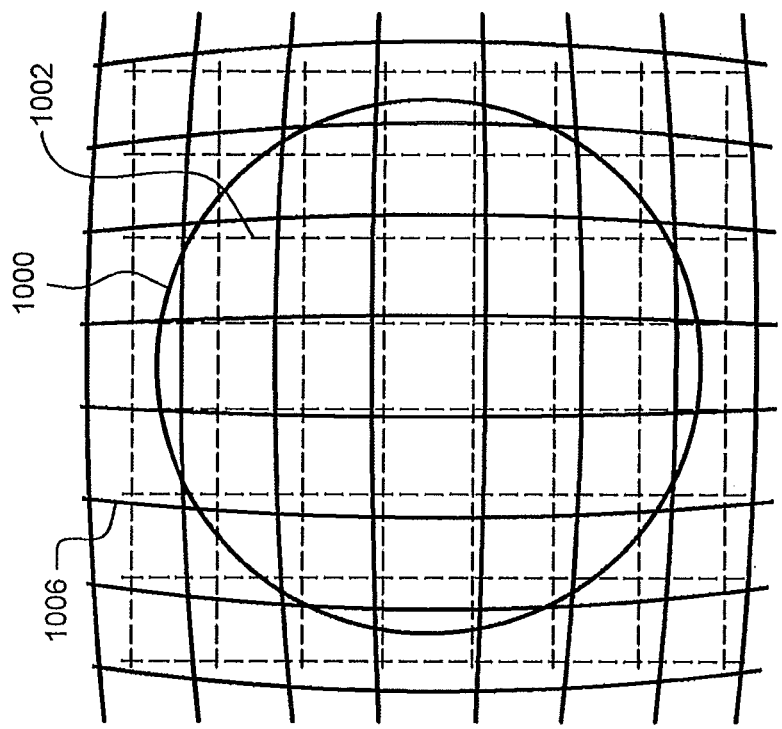
FIGS. 1A, 1B and 1C depict barrel, pincushion, and rotational distortions on a wafer bonding surface, in accordance with an embodiment of the present disclosure.
Figure 1A:
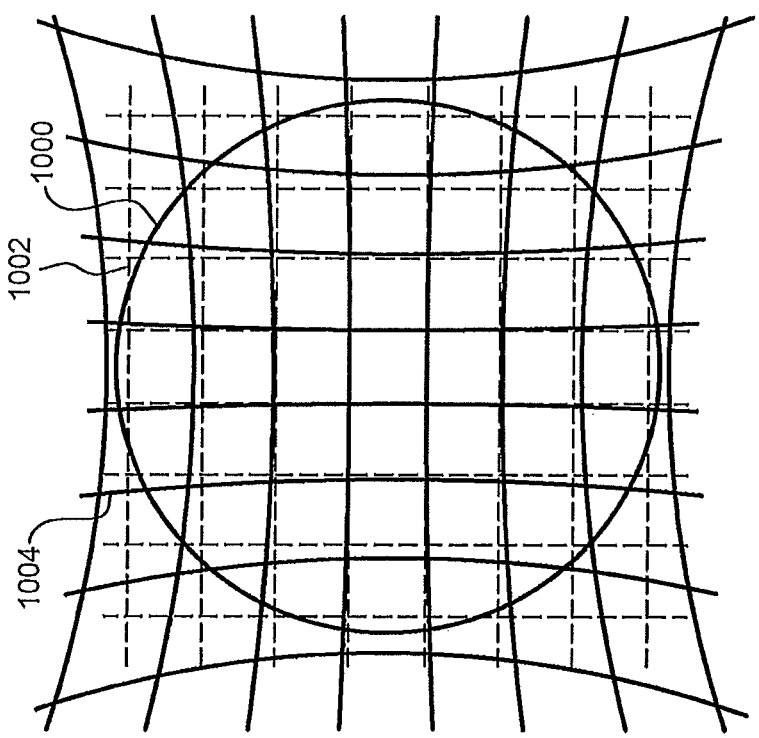
Figure 1C:
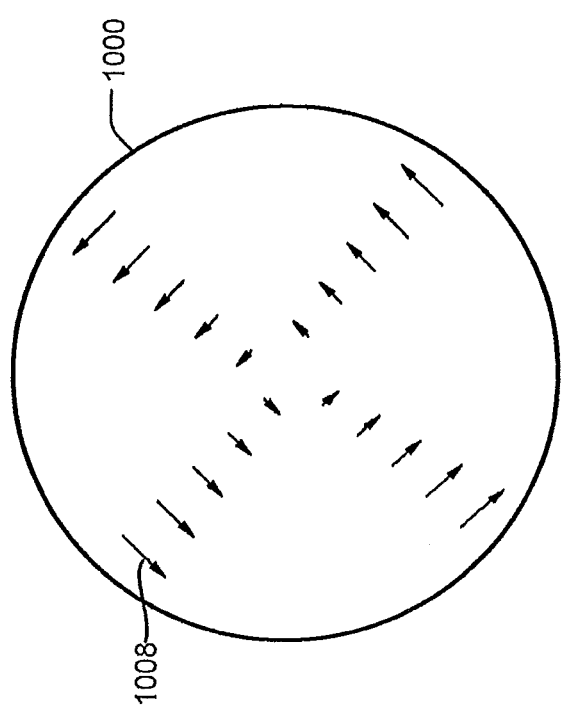

FIGS. 1A-1C illustrate the first two aforementioned types of planar distortion (expansion and rotational) that may be present on the surface of a wafer 1000. FIG. 1A shows a pincushion distortion, as illustrated by a distorted grid 1004 with relation to an ideal grid 1002. Similarly, FIG. 1B shows a barrel distortion, as illustrated by a distorted grid 1006 with relation to ideal grid 1002. FIG. 1C shows a rotational distortion, as illustrated by a vector field 1008. Each vector of the vector field represents a direction and magnitude of the distortion from ideal of a particle on the undistorted surface of wafer 1000 to which the origin of the vector is connected. As shown in this illustration of a pure rotational distortion, all distortions are perpendicular to radii of wafer 1000, with the vector magnitude largest near the edge of the wafer, decreasing to zero at the center. This exemplary distortion is typically called a "twist" distortion. With regard to translational distortion, the third type of distortion mentioned above, at a macro level, this may often be counteracted through alignment of the wafers prior to bonding.

Figure 2:
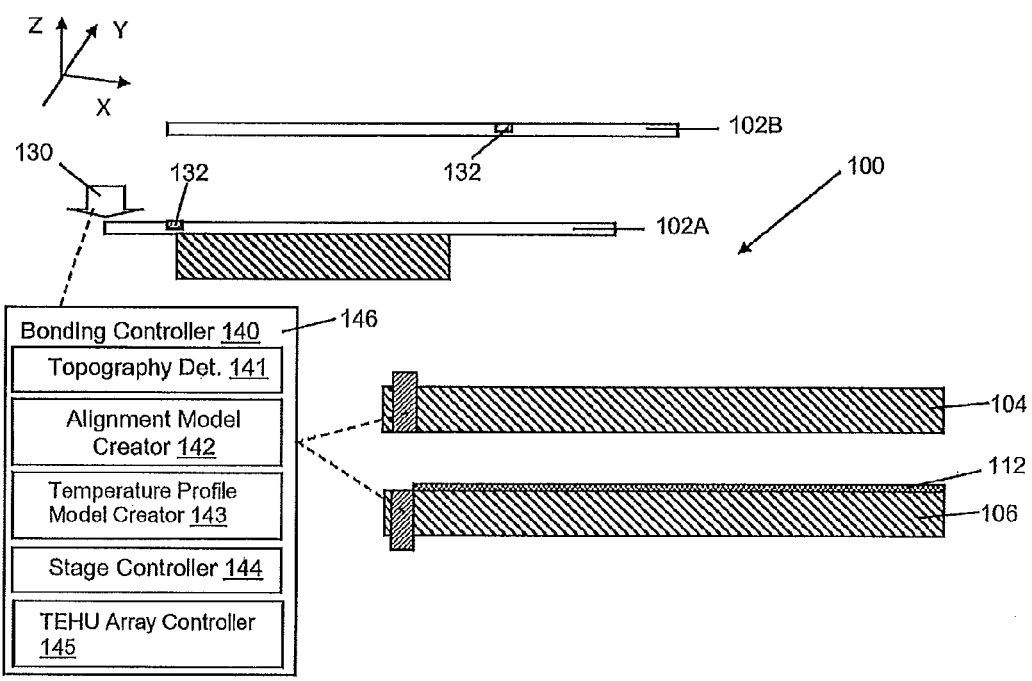
FIGS. 2-8 depict embodiments of a system and method for bonding two circuitry-including substrates or wafers according to the present disclosure, with FIGS. 3A and 3B depicting a related stage for holding a substrate or wafer.

FIG. 2 shows embodiments of a system 100 for bonding two circuitry-including substrates or wafers 102A, 102B. Each circuitry-including substrate 102A, 102B may include, for example, a semiconductor wafer having patterned circuitry (not shown) in a surface thereof. Dielectric material may surround the circuitry. Circuitry in one substrate 102A is meant to be aligned and bonded with corresponding circuitry in substrate 102B to form a larger device/circuit.

Each substrate 102A, 102B may be prepared in accordance with known methods, for example, a bonding layer may be prepared on each of the first and second wafer articles 102A, 102B. In particular examples, the bonding layer can be or can include an oxide, such as an oxide of silicon. In one example, the bonding layers can be formed by a low temperature chemical vapor deposition ("CVD") such as from a TEOS (tetraethylorthosilicate) precursor material. In some cases, the oxide deposition used to form the bonding layer can have a gap-filling characteristic and a tendency for self-planarization of the surface which faces away from the surface of the original wafer article 102A, which self-planarization may occur during the deposition, after the deposition such as during post-deposition baking, for example, or to some extent both during and after the deposition. In such cases, the exposed surface of the bonding layer may be sufficiently planar as formed. In other cases, the bonding layer as deposited may conform to contours of the underlying topography of the wafer article, and then may undergo one or more further planarization processes to planarize the exposed surface of a bonding layer, such as by one or more of processing with an abrasive, e.g., polishing or chemical mechanical polishing, etching or "wet clean processes", thermal treatments however performed, e.g., baking, rapid thermal processing, transfer of heat from a solid, liquid or gaseous medium, application of ultrasonic energy, e.g., for densifying or otherwise altering a characteristic of the bonding layer.

In other examples, the bonding layers can be or can include a polymeric material such as an adhesive material, which can be applied by a variety of ways. For example, a polymeric material such as polyimide, polyamide, photoresist, benzocyclobutane ("BCB") or other suitable adhesive material can be deposited to exposed surfaces of the wafer articles 102A, 102B by spin-on techniques or spray-on techniques, which adhesive material may also self-planarize during deposition. Some photoresists have properties similar to a material such as BCB in that areas of the photoresist exposed to radiation remain while unexposed areas are removed when the photoresist image is developed. Such materials can also be patterned to permit access to conductive features of the wafer articles, as will be described further below.

In still other examples, the bonding layer of each wafer article 102A, 102B can be a patterned metal layer that has been patterned into a plurality of individual metal features so as to provide mechanical and electrical coupling between the wafer articles either by direct bonding of the metal features to one another or using a bond metal, e.g., solder, tin, copper or suitable metal to bond the metal layers to one another. The metal features may include metal pads, pillars, studs, or other structure, for example. Such metal features can include metal features electrically coupled to the metal features of the underlying wafer, or may include metal features which are not electrically coupled to the metal features of the underlying wafer.

In yet another example, a bonding layer can be formed on a wafer article which includes elements of both an oxide layer and patterned metal features, both of which are exposed at a surface of a bonding layer of a first wafer article 102A and which are mated with corresponding patterned metal features and an oxide layer of the other bonding layer of a second wafer article 102B.

As shown in FIG. 2, system 100 includes a first stage 104 for holding a first circuitry-including substrate 102A and a second stage 106 for holding a second circuitry-including substrate 102B. At least one stage 104, 106 may include any now known or later developed mechanisms for controlling lateral X, Y and vertical Z movement, e.g., pneumatic controllers, motors, transmission systems, etc. Each stage 104, 106 may further include conventional structure such as a vacuum or mechanical coupler (not shown) for holding a substrate 102A, 102B to the stage. As the detail of these mechanisms is known in the art, no further description is necessary.

Figure 3A:
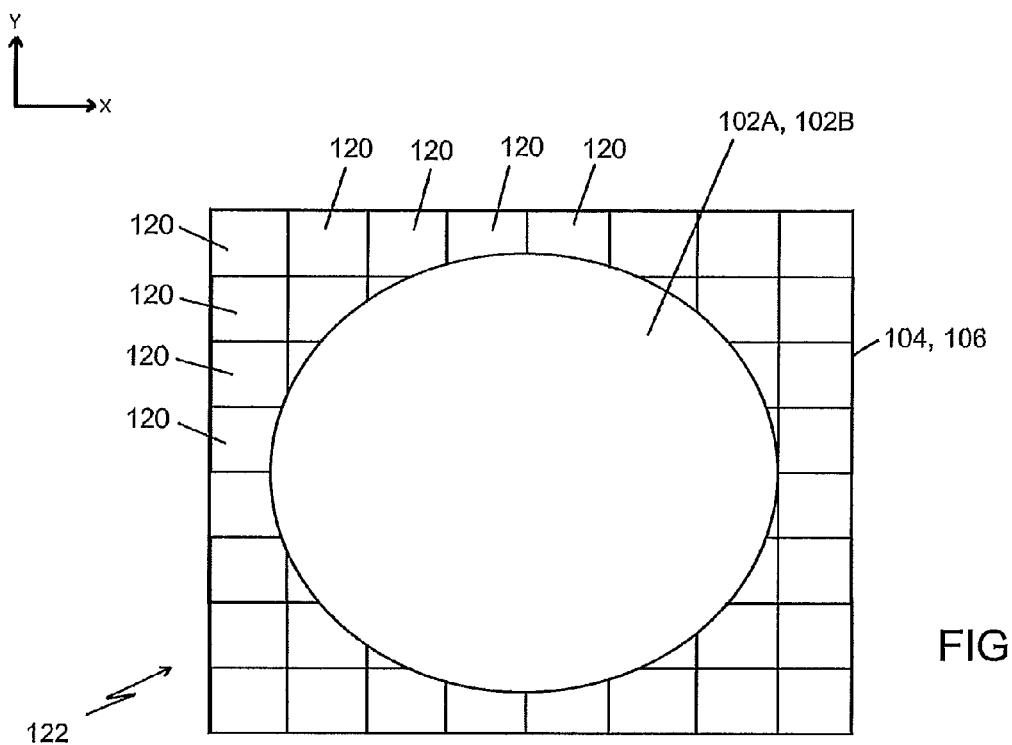
Figure 3B:
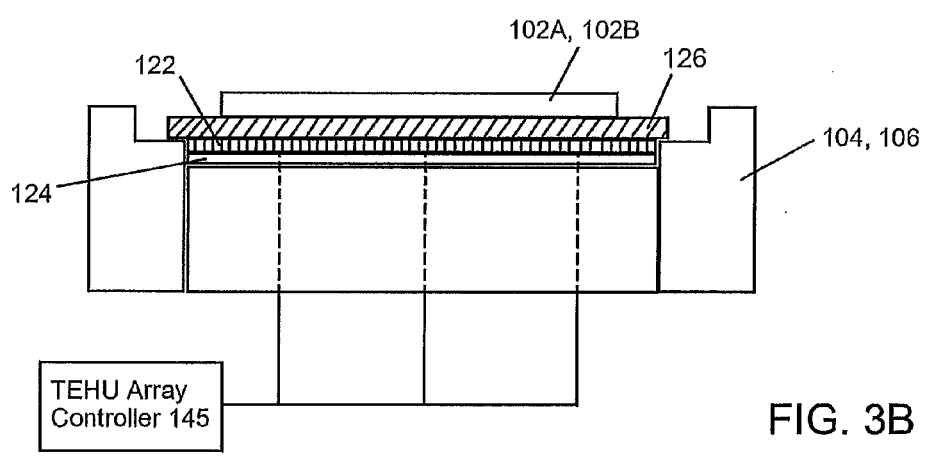

Referring now to FIGS. 3A-3B, in a preferred embodiment, each stage 104, 106 includes a plurality of adjacent thermoelectric heating units (TEHUs) or thermal actuators 120 arranged in an array 122 attached to or integrated with the stage for thermally adjusting at least one of the substrates 102A, 102B, i.e., via a thermoelectric heating unit (TEHU) array controller 145 in a bonding controller 140 (FIG. 2). That is, the temperature of each thermal actuator 120 may be individually controlled to thermally treat the substrate 102A, 102B over a surface area approximately equal to or corresponding with the dimensions of each TEHU. In at least one embodiment, as shown in FIG. 3A, the TEHU array 122 may be comprised of a plurality of directly adjacent, e.g. contacting, TEHUs 120 having X and Y orthogonal planar dimensions. In contrast to stages allowing for "ring type" zone heating of the prior art, wherein concentric rings of spaced thermal actuators effect a thermal change over separate primary radial heating zones created by each concentric ring, the TEHU array 122 of the present disclosure is an active grid or matrix which allows for precise thermal adjustment at any number of points throughout the array, e.g. thermal treatment is not limited to a radial symmetry and may be in a non-uniform configuration or pattern. The refined precision that the present disclosure enables can yield much better accuracy when compared to approaches in the prior art utilizing larger radial "ring type" zones. In an embodiment, the "hot" side of the TEHU array 122 is in contact with the bottom surface of the chuck 126, which may be a silicon carbide (SiC) chuck, while the "cool" side is thermally ground via a thermal ground plane 124 electrically interconnected with the TEHU array 122 to ground adjacent TEHUs in the array to maintain the same temperature. Each TEHU may have a separate input power (not shown) to the bottom surface of the chuck. In one or more embodiments, the SiC-Si interfacial thermal resistance between an SiC chuck 126 and a silicon (Si) substrate 102A, 102B may be accounted for by providing a thin layer therebetween with appropriate thermal impedance.

The number of TEHUs in the array 122 and dimensions of each TEHU may be determined in accordance with alignment requirements, for example, each TEHU may have dimensions of about 1×1 cm$^2$, and the TEHU array may have X-Y planar dimensions greater than the diameter of the substrate 102A, 102B (FIG. 3A). For a typical wafer or substrate having a diameter of 300 mm, with a TEHU dimension of 1×1 cm$^2$, a resolution (e.g. the number of TEHUs in the array) of approximately 900 (30×30) may be achieved, depending on alignment needs. In general, the higher the resolution of the TEHU array, the more precise control over thermal treatment which can be achieved. The thermal adjustment provided by each thermal actuator 120 induces expansion or contraction and may correct for a local error and/or a substrate bow. For example, a 1° C. temperature gradient between adjacent TEHUs can yield about 26 nm of thermal expansion. It should be understood by those skilled in the art that, as used herein, the use of the term "thermal expansion" may generally refer to inducing one or both of thermal expansion as well as negative thermal expansion (e.g. contraction). Advantageously, because the substrate 102A, 102B sits within a TEHU array 122 which has dimensions larger than the diameter of the substrate, this allows for more precise control over thermal treatment of the perimeter (i.e. boundary) of the substrate 102A, 102B, which is not possible with stages allowing for radial "ring type" heating of the prior art. For a typical wafer or substrate measuring 300 mm in diameter, with a TEHU dimension of 1×1 cm$^2$, a thermal gradient of about 1.8° C. from the center of the wafer or substrate to the edge may be achieved, if so needed, in one example that may require radial expansion from wafer center to wafer edge. However, an advantage of the present disclosure is that such thermal gradients can be achieved in various directions and without necessarily a radial symmetry, providing for increased flexibility over prior art solutions.

Each thermal actuator 120 may be capable of heating alone, cooling alone or both. In one embodiment, each thermal actuator 120 includes a Peltier element, which includes a junction of two metals through which an electric current may be passed to cause a temperature increase or decrease therein. Alternatively, each thermal actuator 120 may include a resistive element, for example, where heating only is required. A resistive element may include a material that provides electrical resistance and heats up when a current is applied thereto. A combination of Peltier element(s) and resistive element(s) may also be employed. In either case, the amount of thermal shift desired can be calibrated to the type(s) of devices used for precision control. The temperature change is transmitted to thermal actuator(s) 120 in the TEHU array 122 attached to or integrated with the respective stage 104, 106, and subsequently to a corresponding surface area of a substrate 102A, 102B, as will be described in greater detail below. Although each stage 104, 106, and the TEHU array attached thereto, is illustrated in a polygonal shape, it is understood that other shapes are also possible. Further, it should be understood that in accordance with the objects of the present disclosure, the TEHU array 122 is an active grid with no limit as to geometry, e.g. the activated TEHUs may be in any geometric configuration or pattern required to achieve a desired substrate alignment.

In addition, according to at least one embodiment, each stage 104, 106 may also include a plurality of piezoelectric devices (not shown), which include piezoelectric actuators and sensors, for mechanically adjusting, e.g., forming a bow or correcting a bow, of a substrate 102A, 102B attached thereto and for sensing force applied thereto. As described above, adjustment of the substrate 104, 106 to correct for a local error and/or a substrate bow is primarily achieved by thermal expansion of the substrate via a plurality of TEHUs 120; however, in accordance with at least one embodiment, a plurality of piezoelectric devices may function in combination with the TEHU array 122 to achieve the desired result. Piezoelectric actuators of piezoelectric devices may be distributed substantially uniformly over stages 104, 106, and any number of devices may be provided. Piezoelectric actuators of piezoelectric devices may be positioned below a flexible membrane 112 (stage 106 in FIG. 2 only).

Returning to FIG. 2, system 100 also includes an alignment mark identifier 130 for identifying an alignment mark(s) 132 (greatly enlarged for clarity) on each substrate 102A, 102B (only one shown on each, but could be any number). An alignment mark 132 may be any now known or later developed structure identifiable, e.g., using a laser, from a surface of a substrate 102A, 102B. Alignment marks 132 are common in substrates 102A, 102B for purposes of locating circuitry on a substrate 102A, 102B for photolithography purposes. However, these alignment marks are generally not employed as mechanisms for alignment during bonding of substrates. Alignment marks 132 alone, however, are not satisfactory for alignment and bonding to the accuracy required for three dimensional integration (3DI) at the device/circuit level. Alignment mark identifier 130 may include any now known or later identified infrared, visible light, laser based system or a form of image recognition.

Furthermore, system 100 includes a bonding controller 140 including a topography determinator (Det.) 141, an alignment model creator 142, a wafer temperature profile model and local heat flux profile model creator 143, a stage controller 144, and a thermoelectric heating unit (TEHU) array controller 145. As will be described in greater detail below, topography determinator 141 determines a topography of structures on each substrate 102A, 102B, alignment model creator 142 maps the planar distortions of each substrate and creates an alignment model based on the topographies, temperature profile model creator 143 deduces necessary local thermal expansion measurements for each wafer based on the alignment model and translates the thermal expansion measurements into a non-uniform wafer temperature profile model and a local heat flux profile model for each substrate, stage controller 144 controls movement of at least one of stages 104, 106, and TEHU array controller 145 controls an array of thermal actuators 120 to thermally treat the first and second wafers, respectively, during the wafer to wafer bonding process in accordance with the wafer temperature profile and heat flux profile models to induce thermal expansion.

Bonding controller 140 may include a computer infrastructure 146, e.g., including a computing device, that can perform the various process steps described herein. The computing device may include a memory, a processor (PU), an input/output (I/O) interface, and a bus. Further, the computing device may be in communication with an external I/O device/resource and a storage system. As is known in the art, in general, the PU executes computer program code, such as alignment model creator 142, that is stored in memory and/or a storage system. While executing computer program code, the PU can read and/or write data to/from memory, a storage system, and/or I/O interface.

In any event, the computing device can comprise any general purpose computing article of manufacture capable of executing computer program code installed by a user (e.g., a personal computer, server, handheld device, etc.). However, it is understood that the computing device and bonding controller 140 are only representative of various possible equivalent computing devices that may perform the various process steps of the disclosure. To this extent, in other embodiments, the computing device can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, bonding controller 140 is only illustrative of various types of computer infrastructures 146 for implementing the disclosure. For example, in one embodiment, bonding controller 140 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

Figure 4:
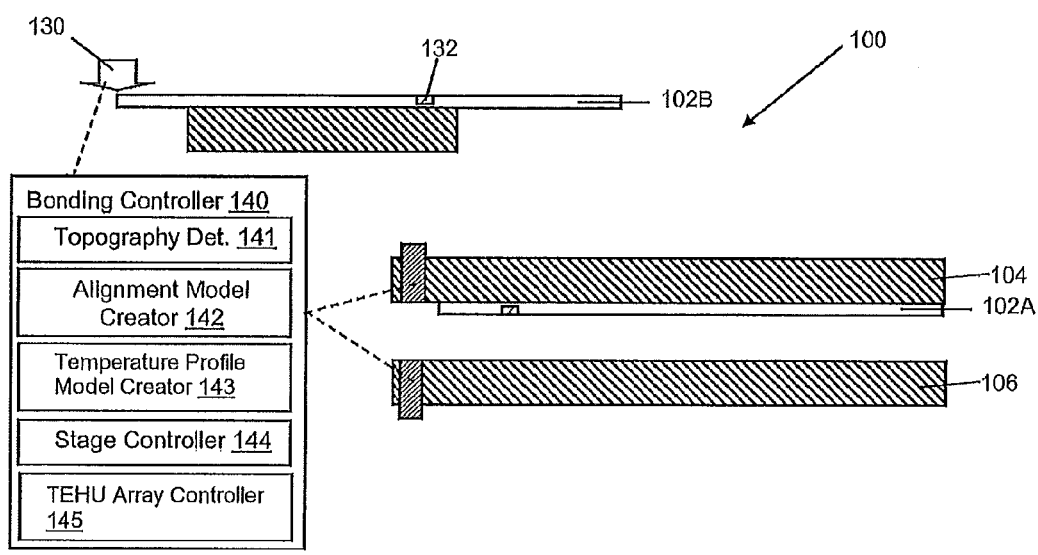

Referring to FIGS. 2-8 collectively, embodiments of a method of bonding two circuitry-including substrates 102A, 102B with system 100 will now be described. In FIG. 2, a first stage 104 for holding a first circuitry-including substrate 102A and a second stage 106 for holding a second circuitry-including substrate 102B are provided, as described above. At this point, the process may include ancillary processes such as loading substrates 102A, 102B, performing a (solvent) clean in preparation of bonding, and pre-aligning substrates 102A, 102B based on their respective alignment notches, etc. Next, as shown in FIG. 2, alignment mark identifier 130 identifies at least two alignment marks 132 on each substrate 102A, 102B. For clarity, FIG. 2 depicts the identification of only a first alignment mark 132; however, it should be understood that at least two alignment marks should be identified and recognized on each substrate. In at least one embodiment, the entire matrix of alignment marks 132 is read in order to identify the distorted grid in relation to the ideal grid expected. Note, that the identification for each substrate 102A, 102B does not necessarily have to occur simultaneously or immediately sequentially. For example, FIG. 2 shows alignment mark identifier 130 identifying an alignment mark 132 for substrate 102A only, and FIG. 4 shows substrate 102A loaded to first stage 104 after having been flipped over, and substrate 102B being evaluated by alignment mark identifier 130.

Figure 5:
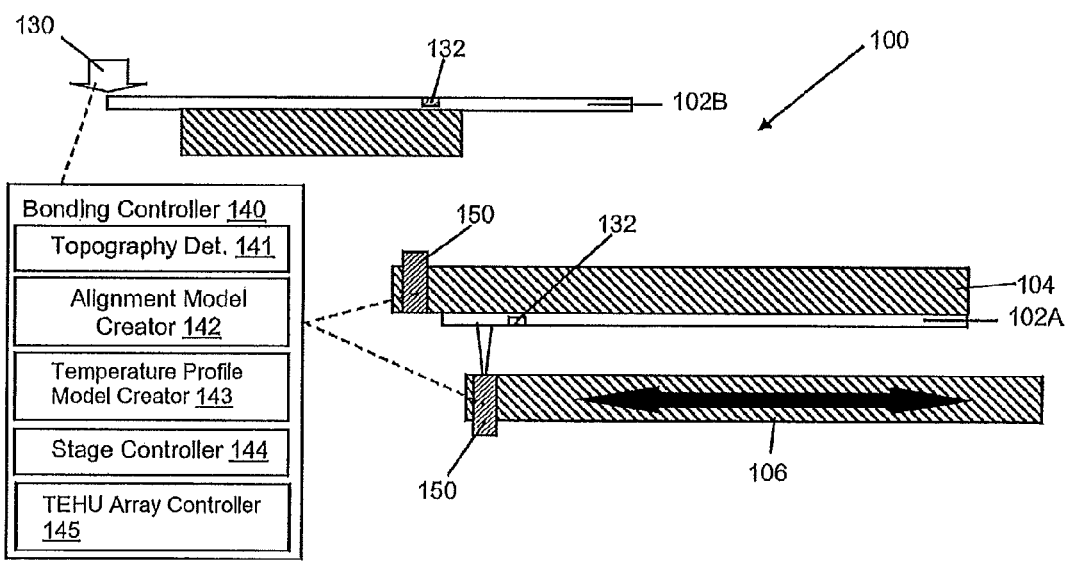

FIG. 5 shows one exemplary embodiment of the method according to the present disclosure, wherein a topography determinator 141 determines a location (in X, Y coordinates) and a topography (in Z coordinate) of alignment mark(s) 132 using laser diffraction. More specifically, each substrate 102A, 102B includes circuit structure in a surface thereof and may include localized anomalies (e.g., particle contamination, larger or smaller than intended structure, etc.) that must be addressed to improve the accuracy of bonding alignment. The topography of each substrate, while not critical for oxide-oxide bonding, can be of significant importance in metal-metal bonding. The location and topography of each alignment mark, which are typically dispersed about substrates 102A, 102B, provide a representation of the overall topography of the substrates 102A, 102B. That is, the topography includes Z coordinates of structures, including local anomalies, and also a substrate bow of substrates 102A, 102B. The number of data points collected and evaluated can be user defined. In the exemplary embodiment shown, one stage 104 or 106 includes measurement optics 150 (e.g., laser) to measure the diffraction. Measurement optics 150 may include an optical path through a respective stage 104, 106 and equipment to perform diffraction, interferometric, grazing angle, reflective or other measurement techniques for topography and location determination. The respective stage 104 or 106 (in this case, stage 106) may be moved using stage controller 144. Measurement optics 150 is directed by topography determinator 141 to determine the topography of a substrate 102A, 102B on an opposite stage 104,106. However, it is understood that measurement optics 150 may be separately mounted and movable.

Figure 6:
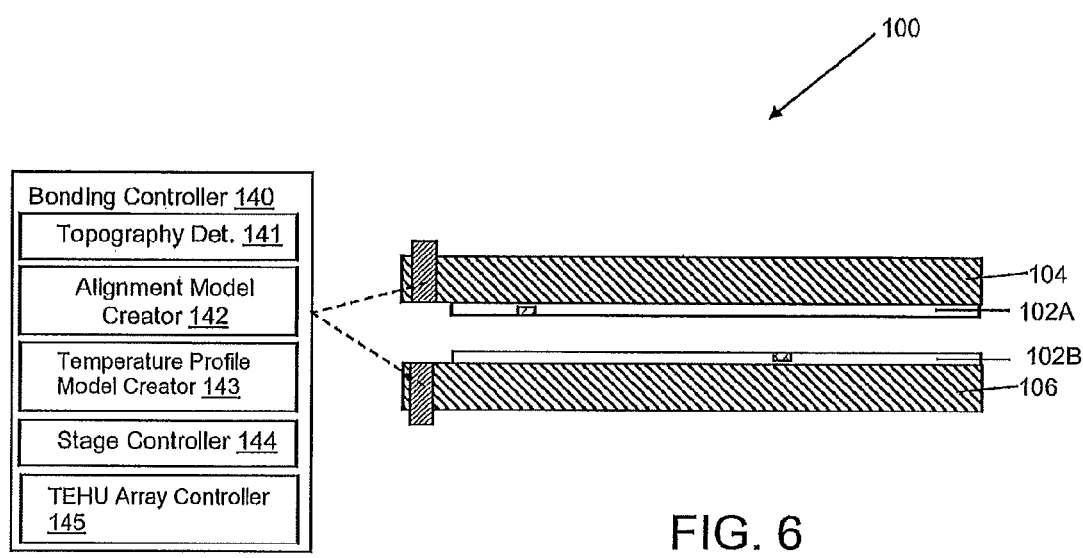

For efficiency, during the FIG. 5 process, an alignment mark(s) 132 may be identified by alignment mark identifier 130 for substrate 102B. FIG. 6 shows second substrate 102B loaded onto second stage 106. No flipping of second substrate 102B is necessary.

Figure 7:
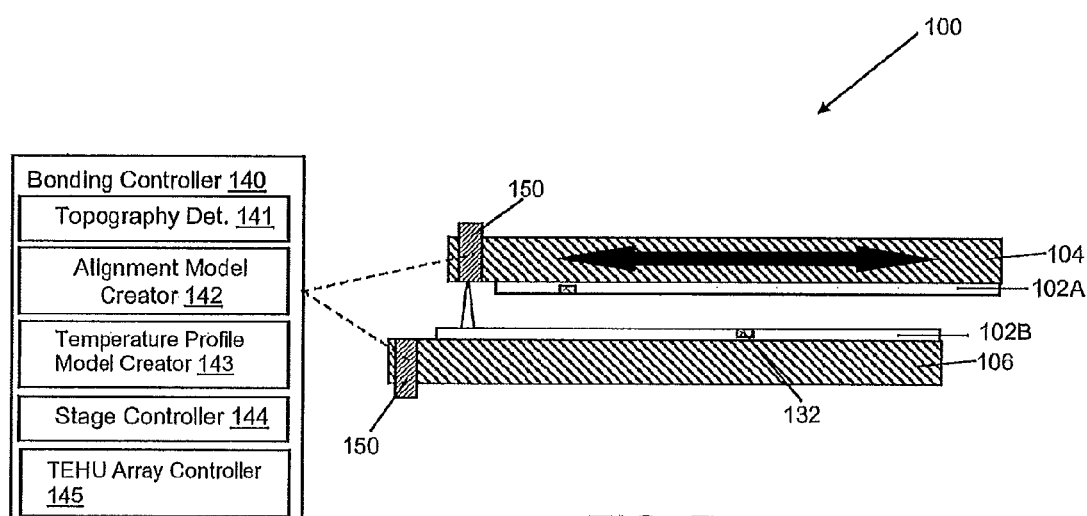

FIG. 7 shows topography determinator 141 determining a location and a topography of an alignment mark 132 on substrate 102B using laser diffraction in a manner substantially similar to that described above relative to substrate 102A. In this case, however, first stage 104 is moved to scan measurement optics 150, using stage controller 144, over second substrate 102B. However, it is understood that measurement optics 150 may be separately mounted and movable.

It should be understood that the method of analyzing and determining the topography of the respective bonding surfaces of substrates 102A, 102B, including localized anomalies and distortions, that must be addressed to improve the accuracy of bonding alignment, as described above, is simply illustrative of one such method of determining planar distortions, and that any known method in the art may also be used in accordance with the present disclosure. It should also be understood that in alternative embodiments of the method herein described, such as in embodiments for oxide-oxide bonding of substrates, the step of determining the topography of the substrates using topography determinator 141 may be omitted.

At this point, alignment model creator 142 creates an alignment model for substrates 102A, 102B based on the location and topography of alignment mark(s) 132 of substrates 102A, 102B. More specifically, each substrate 102A, 102B includes localized anomalies (or errors) that must be addressed to improve the accuracy of bonding alignment. Alignment model creator 142 maps the planar distortions of each substrate (as determined by the topology determinator 141 and alignment mark identifier 130) and creates a model for adjusting the topography of substrate 102A, 102B based on alignment marks 132 during bonding so as to achieve a more accurate bonding alignment. More specifically, rather than simply evaluating conventional parameters such as translational and rotation data, the alignment model may incorporate translation data, rotation data, magnification data and substrate bow data. Alignment model creator 142 uses this data to generate an alignment model that includes localized corrections.

It should be understood by those skilled in the art that the method of global wafer-to-wafer alignment (prior to the bonding process), as described above, is simply illustrative of one such method of wafer-to-wafer alignment and that any known method of alignment may be employed prior to performing detailed thermal modeling to predict the specific temperature pattern required to induce thermal expansion or contraction during the bonding step, as in the present disclosure.

Based on the mapping of the planar distortions and the alignment model, temperature profile model creator 143 then determines or deduces the necessary local wafer thermal expansion (magnification) adjustments for each wafer to compensate for the relative distortions and translates the thermal expansion measurements into a non-uniform temperature profile model and a local heat flux profile model for each wafer. Bonding controller 140 includes an algorithm containing the relationship between location and topography measurements and the temperature of a wafer under a bonding process. Such a relationship may be obtained, for example, through empirical data. Once the temperature profile model creator 143 receives the data from the alignment model creator 142, the bonding controller 140 applies the algorithm to translate the measured data into temperature data.

Thereafter, temperature profile model creator 143 uses the data to create a non-uniform wafer temperature profile and a local heat flux profile for each wafer. The temperature and heat flux profiles may incorporate various wafer-to-wafer bonding process parameters, e.g. parameters for illumination, wafer and/or stage temperature distribution, and heating time. Further, the respective profiles may incorporate basic assumptions and parameters including but not limited to thermal density $\alpha$ (110 mm$^2$ s$^{-1}$ for a silicon chuck and 160 mm$^2$ s$^{-1}$ for a silicon carbide chuck), mass density $\rho$ (3.2 g cm' for silicon carbide), thermal conductivity $\kappa$ (140 W m$^{-1}$ K$^{-1}$ for silicon and 300 W m$^{-1}$ K$^{-1}$ for silicon carbide), and the SiC-Si interfacial thermal resistance (50 mm$^2$ K W$^{-1}$, under medium vacuum).

Figure 8:
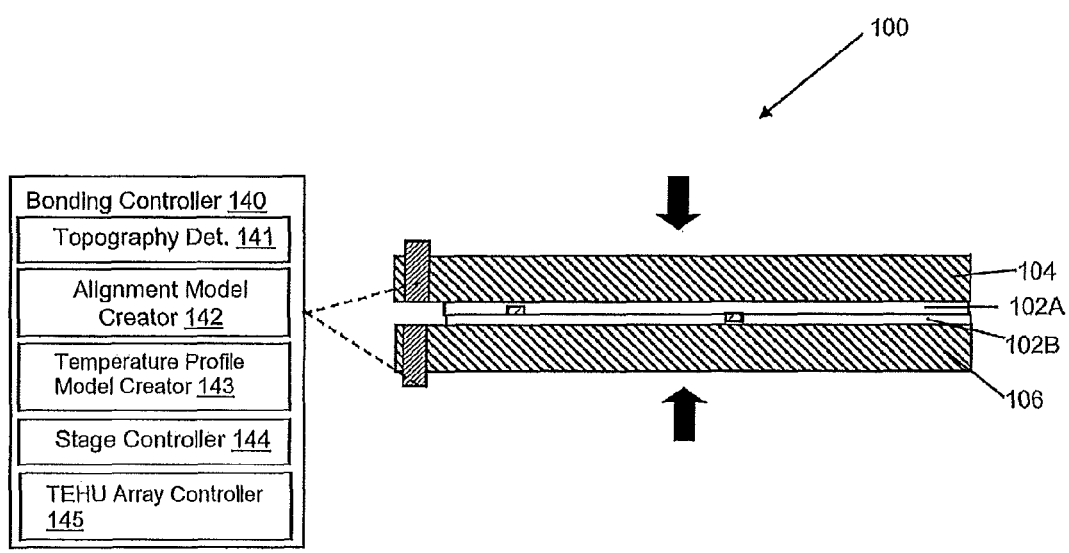

As shown in FIG. 8, bonding controller 140 directs bonding of first and second circuitry-including substrates 102A, 102B together while aligning first and second substrates 102A, 102B based on the alignment model. Bonding begins at the center of substrates 102A, 102B by moving stages 104, 106 together, e.g., via stage controller 144. Alignment marks 132 may be used to ensure proper alignment using the alignment model. Note, however, that alignment marks 132 do not necessarily have to be aligned relative to one another in order for the benefits of knowing and using their location to be achieved. Prior to bonding and/or simultaneously therewith localized corrections can be made to the substrates 102A, 102B based on the alignment model. For example, localized or global mechanical adjustments can be made via piezoelectric devices, i.e., the actuators thereof, to adjust for, for example, substrate bow differences. The progression of a bond front may be determined based on the force sensed by piezoelectric devices, i.e., the sensors thereof.

Furthermore, the bonding includes simultaneously thermally adjusting at least one of substrates 102A, 102B in situ to induce thermal expansion or negative thermal expansion.

For a particular measurement at a particular location on the substrate or wafer, TEHU array controller 145 adjusts one or more thermal actuators 120 in accordance with the non-uniform wafer temperature profile and local heat flux profile created for each wafer, as described above. In contrast to stages with "ring-type" heating of the prior art, wherein concentric rings of spaced thermal actuators effect a thermal change over separate primary radial heating zones created by each concentric ring, the TEHU array controller 145 may adjust the individual temperature of one or more TEHUs 120 in the active grid, as needed, which may be clustered or in a non-uniform configuration or pattern, in accordance with the temperature profile and a local heat flux profile created for each wafer. Because thermal actuators 120 (FIG. 3A) are closely placed together and well distributed across a surface of a stage 104, 106, it allows precise tuning of substrate 102A, 102B expansion or contraction at those points, molding the shape to the required alignment tolerance, e.g. within prescribed tolerances in X and Y orthogonal horizontal directions. In this case, one can maximize chip-to-chip alignment by, for example, controlling image shifts due to substrate temperature, i.e., magnification errors related to different coefficient of thermal expansion (CTE) issues. That is, localized thermal adjustments can be made via thermal actuators 120 (FIG. 3A) so as to achieve a much more granulated alignment adjustment. As described above, a 1° C. temperature gradient between adjacent TEHUs can yield about 26 nm of thermal expansion. Bonding controller 140 may also use the alignment model to evaluate for proper alignment as bonding progresses. This is especially the case for challenging, heavily distorted wafers or substrates with non-radial symmetries in the distortion profiles, which would not be correctable with prior art solutions. The above-described method, system and program product may achieve an alignment accuracy in the range of 0 to 0.5 μm, and preferably below 0.25 μm. Alignment accuracy refers to the chip-to-chip overlay alignment, after bonding has occurred.

While shown and described herein as a method and system for bonding two circuitry-including substrates, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in part in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to bond two circuitry-including substrates. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a tape, a rigid magnetic disk and an optical disk.

Current examples of optical disks include compact disk-read only memory (CD-ROM), compact disk-read/write (CD-RAN) and DVD.

A data processing system suitable for storing and/or executing program code will include at least one processing unit coupled directly or indirectly to memory elements through a system bus. The memory elements can include local memory, e.g., memory, employed during actual execution of the program code, bulk storage (e.g., a memory system), and cache memories which provide temporary storage of at least some program code in order to reduce the number of times code must be retrieved from bulk storage during execution.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/ driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

While the present disclosure has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present disclosure.

Thus, having described the disclosure, what is claimed is:

1. A method of improving chip-to-chip alignment accuracy for circuitry-including wafer-to-wafer bonding, comprising:
   providing a first stage for holding a first circuitry-including wafer and a second stage for holding a second circuitry-including wafer, each stage including a plurality of adjacent thermal actuators arranged in an array integrated with the stage;
   determining planar distortions of a bonding surface of the first and second circuitry-including wafers;
   mapping the planar distortions for each wafer based on the relative planar distortions thereon;
   deducing necessary local thermal expansion measurements for each wafer to compensate for the relative distortions based on the mapping;
   translating the thermal expansion measurements into a non-uniform wafer temperature profile model and a local heat flux profile model for each wafer;
   aligning the first and second circuitry-including wafers; and
   bonding the first and second wafers together while simultaneously thermally treating at least one of the wafers in situ by individually adjusting the temperature of one or more thermal actuators in the array in accordance with the wafer temperature profile model and the local heat flux model to induce thermal expansion over a surface area corresponding to the dimensions of each adjusted thermal actuator.

2. The method of claim 1 wherein the thermal actuator array has X-Y planar dimensions greater than the diameter of each wafer.

3. The method of claim 1 wherein the plurality of thermal actuators includes at least one of a Peltier element and a resistive element.

4. The method of claim 1 wherein the thermal actuator array is thermally ground via a thermal ground plane electrically interconnected with the thermal actuator array.

5. The method of claim 1 further comprising the step of, prior to deducing necessary local thermal expansion measurements for each wafer, determining whether the planar distortions for each wafer are within a prescribed tolerance.

6. The method of claim 1 wherein the thermally treating includes correcting for at least one of a local error and a substrate bow.

7. The method of claim 1 wherein the non-uniform wafer temperature profile model and local heat flux profile model, respectively, comprise at least a thermal diffusivity of the wafer, a mass density of the wafer, and a thermal conductivity of the wafer.

8. The method of claim 1 wherein determining planar distortions of a bonding surface of the first and second circuitry-including wafers comprises determining the position of at least one distortion mark on each wafer.

9. The method of claim 1 wherein mapping the planar distortions for each wafer includes creating an alignment model for each wafer based on the relative planar distortions thereon, and wherein the alignment model incorporates translation data, rotation data, magnification data and substrate bow data.

10. A system for improving chip-to-chip alignment accuracy for circuitry-including wafer-to-wafer bonding, comprising:
   separate stages for holding a first circuitry-including wafer and a second circuitry-including wafer, each stage including a plurality of adjacent thermal actuators arranged in an array integrated with the stage;
   a processor; and
   a memory having a set of instructions recorded thereon which can be carried out by the processor to cause:
   determining planar distortions of a bonding surface of the first and second circuitry-including wafers;
   mapping the planar distortions for each wafer based on the relative planar distortions thereon;
   deducing necessary local thermal expansion measurements for each wafer to compensate for the relative distortions based on the mapping;
   translating the thermal expansion measurements into a non-uniform wafer temperature profile model and a local heat flux profile model for each wafer;
   aligning the first and second circuitry-including wafers; and
   bonding the first and second wafers together while simultaneously thermally treating at least one of the wafers in situ by individually adjusting the temperature of one or more thermal actuators in the array in accordance with the wafer temperature profile model and the local heat flux model to induce thermal expansion over a surface area corresponding to the dimensions of each adjusted thermal actuator.

11. The system of claim 10 wherein the thermal actuator array has X-Y planar dimensions greater than the diameter of each wafer.

12. The system of claim 10 wherein the plurality of thermal actuators includes at least one of a Peltier element and a resistive element.

13. The system of claim 10 wherein the thermal actuator array is thermally ground via a thermal ground plane electrically interconnected with the thermal actuator array.

14. The system of claim 10, wherein the thermally treating includes correcting for at least one of a local error and a substrate bow.

15. The system of claim 10 wherein the non-uniform wafer temperature profile model and local heat flux profile model, respectively, comprise at least a thermal diffusivity of the wafer, a mass density of the wafer, and a thermal conductivity of the wafer.

16. The system of claim 10 wherein determining planar distortions of a bonding surface of a first circuitry-including wafer and a second circuitry-including wafer comprises determining the position of at least one distortion mark on each wafer.

17. The system of claim 10 wherein mapping the planar distortions for each wafer includes creating an alignment model for each wafer based on the relative planar distortions thereon, and wherein the alignment model incorporates translation data, rotation data, magnification data and substrate bow data.

* * * * *